(12) United States Patent
Yuan et al.

(10) Patent No.: US 12,029,000 B2
(45) Date of Patent: Jul. 2, 2024

(54) WATERPROOF CONNECTING STRUCTURE AND ELECTRONIC DEVICE

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Bo-Duo Yuan, Shenzhen (CN); Yan-Lei Cao, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 261 days.

(21) Appl. No.: 17/694,849

(22) Filed: Mar. 15, 2022

(65) Prior Publication Data
US 2022/0304176 A1    Sep. 22, 2022

(30) Foreign Application Priority Data
Mar. 22, 2021   (CN) .......................... 202110304057.0

(51) Int. Cl.
H05K 5/06    (2006.01)
H04M 1/02    (2006.01)
H05K 5/02    (2006.01)

(52) U.S. Cl.
CPC .............. *H05K 5/062* (2013.01); *H05K 5/06* (2013.01); *H05K 5/069* (2013.01); *H04M 1/0249* (2013.01); *H05K 5/0217* (2013.01)

(58) Field of Classification Search
CPC .......... H05K 5/06; H05K 5/062; H05K 5/069; H05K 5/0217; H04M 1/0249
See application file for complete search history.

(56) References Cited

U.S. PATENT DOCUMENTS

| | | | |
|---|---|---|---|
| 10,375,846 B2 * | 8/2019 | I ......................... | B29C 66/12469 |
| 2009/0168389 A1 * | 7/2009 | Sung ...................... | H05K 5/062 |
| | | | 361/814 |
| 2015/0145386 A1 * | 5/2015 | Chang ................. | H04M 1/0249 |
| | | | 312/223.1 |
| 2019/0179375 A1 * | 6/2019 | Huang ................... | H05K 5/062 |
| 2022/0253107 A1 * | 8/2022 | Nguyen Van ....... | H04M 1/0249 |

FOREIGN PATENT DOCUMENTS

| | | | | |
|---|---|---|---|---|
| EP | 1612902 A2 * | 1/2006 | .......... | H02G 15/113 |
| EP | 2579555 A1 * | 4/2013 | ................ | C09J 7/20 |
| WO | WO-2020090289 A1 * | 5/2020 | .......... | H05K 5/0056 |

* cited by examiner

*Primary Examiner* — Nidhi Thaker
(74) *Attorney, Agent, or Firm* — ScienBiziP, P.C.

(57) ABSTRACT

A waterproof connecting structure includes a first housing, a second housing employs a waterproof adhesive layer between the two. The first housing includes a first mounting member with a first groove, the first groove includes a first recessed area. The second housing includes a second recessed area and a protrusion of a certain shape. The second recessed area surrounds an edge of the second housing, the protrusion is disposed close to the second recessed area, and penetrates into the first recessed area. The waterproof adhesive layer is disposed between the first housing and the second housing, and is accommodated in the first groove and the second recessed area. An electronic device including the waterproof connecting structure is also provided.

14 Claims, 4 Drawing Sheets

WATERPROOF CONNECTING STRUCTURE AND ELECTRONIC DEVICE

FIELD

The subject matter herein generally relates to waterproofing, and more particularly, to a waterproof connecting structure and an electronic device including the waterproof connecting structure.

BACKGROUND

Smart wearable devices such as smart phones, watches, wristbands, and UWB positioning tags, or the like, are becoming more and more popular. Such a wearable device may include a connected top housing and a bottom housing. However, the connecting region between the two housings is difficult to waterproof. Even when a waterproof adhesive layer is formed between the connecting region between the two housings, serious overflow of the waterproof adhesive and its consequences may occur during the assembly of the two housings. Thus, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
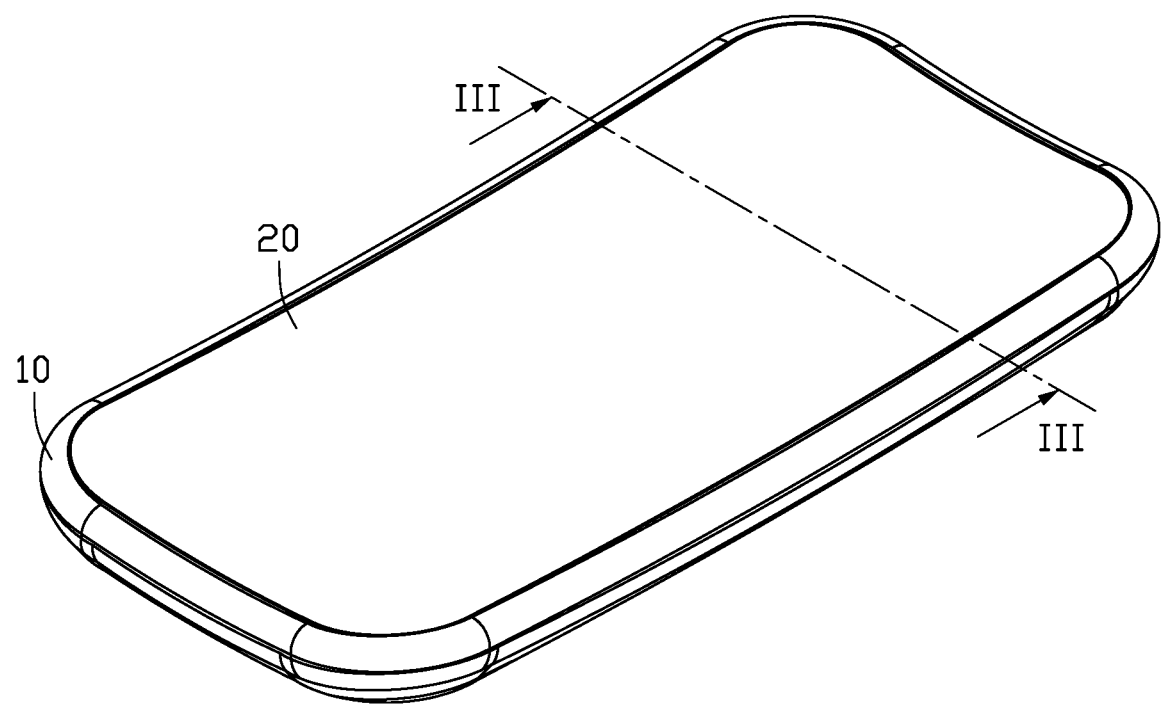
FIG. 1 is a diagrammatic view of an embodiment of a waterproof connecting structure according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Referring to FIG. 1, an embodiment of a waterproof connecting structure 100 is provided. The waterproof connecting structure 100 includes a first housing 10, a second housing 20, and a waterproof adhesive layer 30 (shown in FIG. 3). The waterproof adhesive layer 30 is disposed between the first housing 10 and the second housing 20 for bonding the first housing 10 and the second housing 20 together. Thus, water is prevented from entering the connecting region between the first housing 10 and the second housing 20. The first housing 10 and the second housing 20 can be made of metal, plastic, wood, or the like. The materials of the first housing 10 and the second housing 20 may be the same or different.

Figure 2:
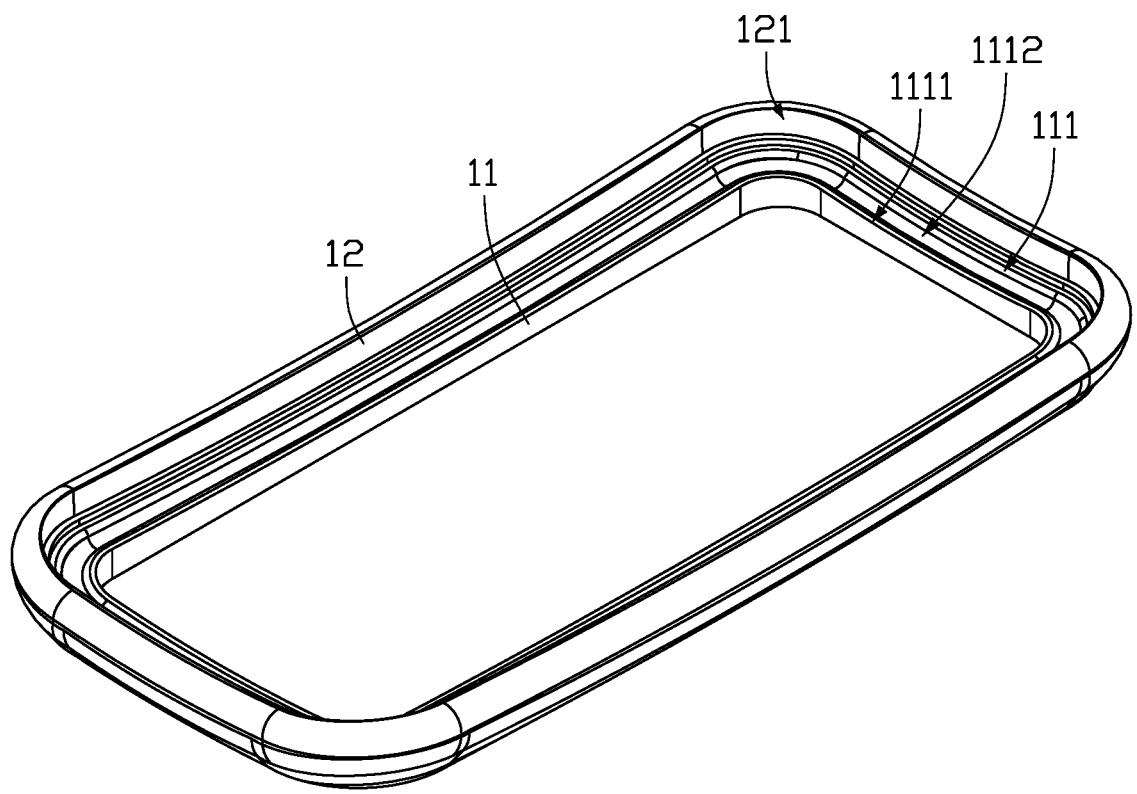
FIG. 2 is diagrammatic view of a first housing of the waterproof connecting structure in FIG. 1.
Figure 3:
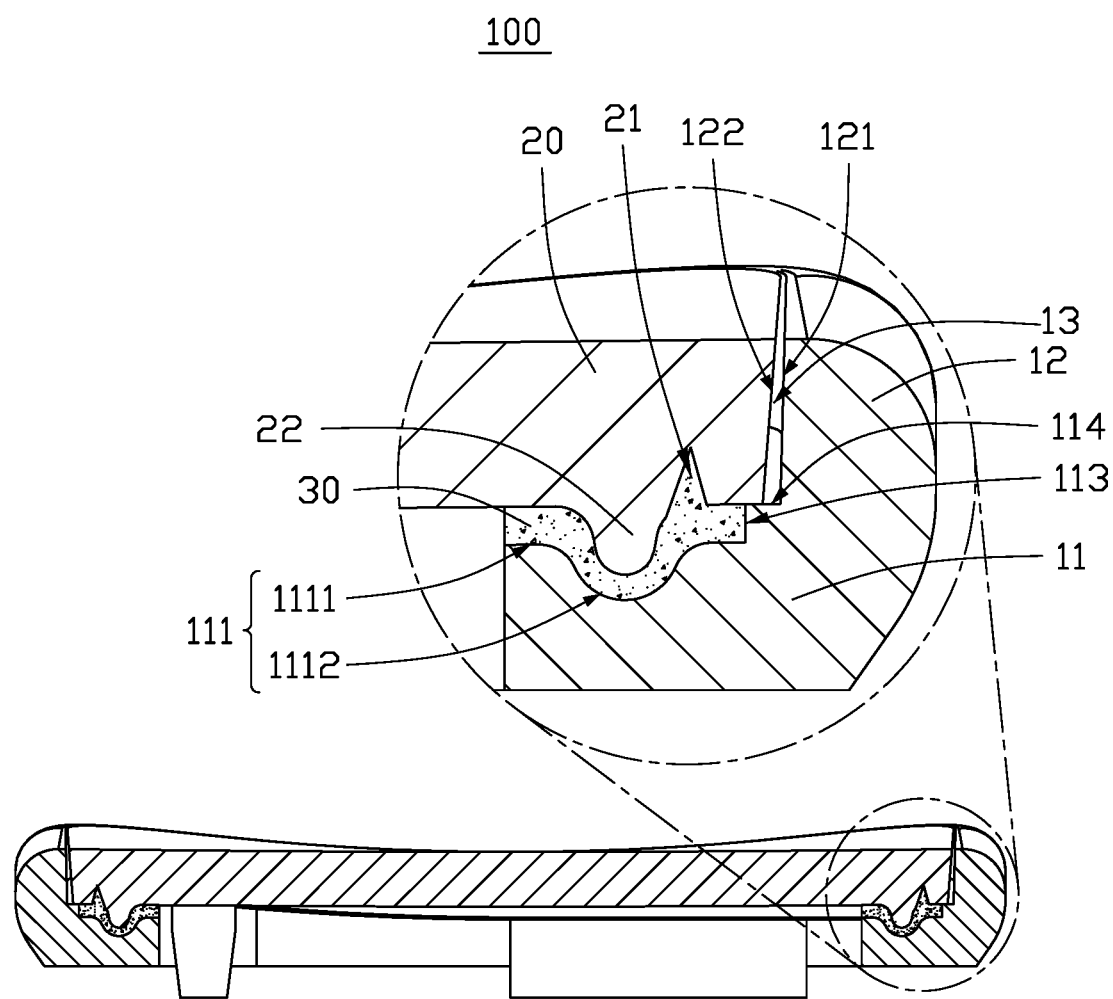
FIG. 3 is a cross-sectional view along line in FIG. 1.

Referring to FIGS. 2 and 3, the first housing 10 includes a first mounting member 11 and a second mounting member 12 extending along an outer edge of the first mounting member 11 and perpendicular to the first mounting member 11. In some embodiments, each of the first mounting member 11 and the second mounting member 12 is frame-shaped, and the first mounting member 11 and the second mounting member 12 are integrally formed. An inner surface of the first mounting member 11 close to the second mounting member 12 is recessed to form a first groove 111. The first groove 111 includes a first supporting surface 1111 perpendicular to the second mounting member 12. The first supporting surface 1111 supports the second housing 20.

The first groove 111 further includes a first recessed area 1112 on the first supporting surface 1111. The first recessed area 1112 accommodates the waterproof adhesive layer 30. The waterproof adhesive layer 30 is formed by curing a waterproof adhesive. The first recessed area 1112 includes a curved surface structure, which increases contact area between the first mounting member 11, the second housing 20, and the waterproof adhesive layer 30. It not only a bonding strength between the first housing 10 and the second housing 20 is increased, but also a waterproof path of water entering from outside is thus lengthened in any event, thus improving the waterproofing effect. In addition, the first recessed area 1112 can hold part of the waterproof adhesive layer 30 to prevent waterproof adhesive from overflowing to the outside and affecting the appearance.

The second mounting member 12 includes an inner surface 121 close to the first mounting member 11. A side of the inner surface 121 close to the first mounting member 11 is inclined toward the first groove 111. Thus, the inner surface 121 and the first supporting surface 1111 form an obtuse angle, which facilitates assembly between the second mounting member 12 and the second housing 20.

In some embodiments, the first mounting member 11 includes a first outer surface 113 and a second outer surface 114. The first outer surface 113 faces the first groove 111, and the second outer surface 114 faces the second mounting member 12. The first outer surface 113 is connected to the first supporting surface 1111 and the second outer surface 114. The first outer surface 113 and the second outer surface 114 cooperatively form a stepped portion, and the second outer surface 114 abuts against the second housing 20, so that a certain thickness of waterproof adhesive layer 30 can be formed between the first housing 10 and the second housing 20 when the first housing 10 and the second housing 20 are pressed together, thereby preventing the waterproof adhesive layer 30 from overflowing out. In this embodiment, the first outer surface 113 is perpendicular to the second outer surface 114. In other embodiments, an angle between the first outer surface 113 and the second outer surface 114 is not limited.

The second housing 20 includes a second recessed area 21 surrounding an edge of the second housing 20. In some embodiments, a cross-section of the second recessed area 21 is zigzag-shaped. The design of the second recessed area 21 reduces a thickness of the second housing 20 at the second recessed area 21. When the first housing 10 and the second housing 20 are disassembled from each other, the second housing 20 is easily broken at the second recessed area 21, facilitating the disassembly of the first housing 10 from the second housing 20.

The second housing 20 is also provided with a protrusion 22 in a form of ring. The protrusion 22 is disposed close to the second recessed area 21, and the protrusion 22 cooperates with the first recessed area 1112. When the first housing 10 is connected to the second housing 20, the protrusion 22 penetrates into the first recessed area 1112 to further lengthen the waterproof path, thereby improving the waterproofing.

The second housing 20 includes an abutting surface 122 facing the second mounting member 12. An end of the abutting surface 122 facing away from the first mounting member 11 is inclined toward the inner surface 121. The inner surface 121 cooperates with the abutting surface 122 to form a gap 13. A width of the gap 13 is larger on the side close to the first mounting member 11 and smaller on the side farther away from the first mounting member 11. The gap 13 plays a guiding role when the second housing 20 and the first housing 10 are assembled together, so as to facilitate the assembly of the second housing 20 and the first housing 10. During the assembly, the waterproof adhesive is also prevented from overflowing out of the first housing 20. At the same time, a long gap between the first housing 10 and the second housing 20 is reduced to further enhance the waterproofing effect.

When assembling the first housing 10 and the second housing 20, the waterproof adhesive is applied on the first supporting surface 1111 and the first recessed area 1112 of the first mounting member 11. Then, the second housing 20 is pressed onto the first housing 10, and the waterproof adhesive infills the second recessed area 21 to form the waterproof adhesive layer 30.

Figure 4:
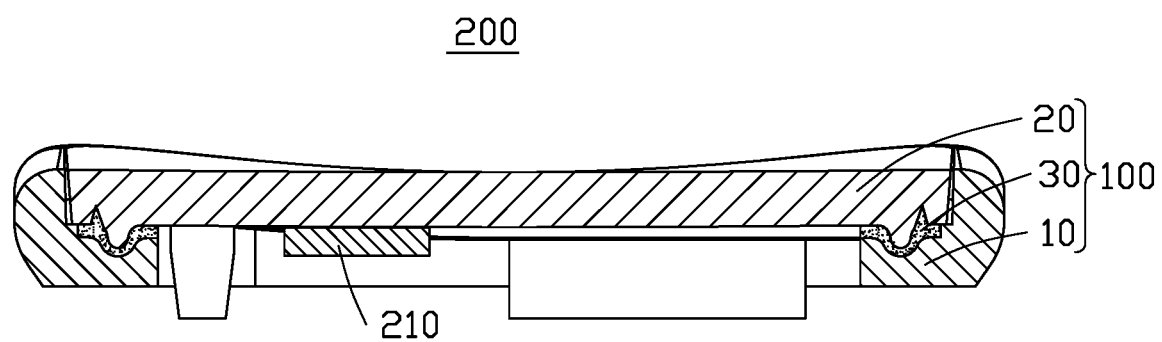
FIG. 4 is a cross-sectional view of an embodiment of an electronic device including the waterproof connecting structure in FIG. 1, according to the present disclosure.

Referring to FIG. 4, in some embodiments, an electronic device 200 including the waterproof connecting structure 100 is also provided. The electronic device 200 further includes a circuit module 210. The circuit module 210 is set in the electronic device 200, and has electrical connections in the electronic device 200. The electronic device 200 may be a mobile phone, a tablet computer, a wearable device, or the like. The waterproof connecting structure 100 protects the circuit module 210 in the electronic device 200.

The protrusion 22 and the first recessed area 1112 form a concave-convex structure in the waterproof connecting structure 100, which lengthens the waterproof path, improves the waterproof effect, and increases the bonding strength the first housing 10 and the second housing 20. By arranging the second recessed area 21 of zigzag-shaped, the waterproofing effect is further increased, and excess waterproof adhesive can be accommodated therein, so as to prevent the waterproof adhesive from overflowing out.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A waterproof connecting structure comprising: a first housing comprising a first mounting member, the first mounting member comprising a first groove, the first groove comprising a first recessed area; a second housing comprising a second recessed area and a protrusion, the second recessed area surrounding an edge of the second housing, the protrusion disposed close to the second recessed area and penetrating into the first recessed area, the first housing further comprises a second mounting member extending along an outer edge of the first mounting member; and a waterproof adhesive layer disposed between the first housing and the second housing, and the waterproof adhesive layer accommodated in the first groove and the second recessed area; wherein the first mounting member comprises a first outer surface and a second outer surface, the first outer surface faces the first groove, and the second outer surface faces the second mounting member; the first outer surface is connected to the second outer surface; the first outer surface and the second outer surface cooperatively form a stepped portion, and the second outer surface abuts against the second housing.

2. The waterproof connecting structure of claim 1, wherein the first groove further comprises a first supporting surface connecting to the first outer surface; the first supporting surface is perpendicular to the second mounting member, and is configured to support the second housing.

3. The waterproof connecting structure of claim 1, wherein the second mounting member comprises an inner surface close to the first mounting member, a side of the inner surface close to the first mounting member is inclined toward the first groove.

4. The waterproof connecting structure of claim 3, wherein the second housing comprises an abutting surface facing the second mounting member, an end of the abutting surface facing away from the first mounting member is inclined toward the inner surface; the inner surface cooperates with the abutting surface to form a gap; a width of the gap is larger on the side close to the first mounting member and smaller on the side farther away from the first mounting member.

5. The waterproof connecting structure of claim 1, wherein a cross-section of the second recessed area is zigzag-shaped.

6. The waterproof connecting structure of claim 1, wherein the protrusion in a form of ring.

7. The waterproof connecting structure of claim 1, wherein each of the first mounting member and the second mounting member is frame-shaped, and the first mounting member and the second mounting member are integrally formed.

8. An electronic device comprising: a waterproof connecting structure comprising: a first housing comprising a first mounting member, the first mounting member comprising a first groove, the first groove comprising a first recessed area; a second housing comprising a second recessed area and a protrusion, the second recessed area surrounding an edge of the second housing, the protrusion disposed close to the second recessed area and penetrating into the first recessed area; and a waterproof adhesive layer disposed between the first housing and the second housing, and the waterproof adhesive layer accommodated in the first groove and the second recessed area, the first housing further comprises a second mounting member extending along an outer edge of the first mounting member; and a circuit module, set in the electronic device, the circuit module configured to realize electrical connection; wherein the first mounting member comprises a first outer surface and a second outer surface, the first outer surface faces the first groove, and the second outer surface faces the second mounting member; the first outer surface is connected to the second outer surface; the first outer surface and the second outer surface cooperatively form a stepped portion, and the second outer surface abuts against the second housing.

9. The electronic device of claim 8, wherein the first groove further comprises a first supporting surface connecting to the first outer surface; the first supporting surface is perpendicular to the second mounting member, and is configured to support the second housing.

10. The electronic device of claim 8, wherein the second mounting member comprises an inner surface close to the first mounting member, a side of the inner surface close to the first mounting member is inclined toward the first groove.

11. The electronic device of claim 10, wherein the second housing comprises an abutting surface facing the second mounting member, an end of the abutting surface facing away from the first mounting member is inclined toward the inner surface; the inner surface cooperates with the abutting surface to form a gap; a width of the gap is larger on the side close to the first mounting member and smaller on the side farther away from the first mounting member.

12. The electronic device of claim 8, wherein a cross-section of the second recessed area is zigzag-shaped.

13. The electronic device of claim 8, wherein the protrusion in a form of ring.

14. The electronic device of claim 8, wherein each of the first mounting member and the second mounting member is frame-shaped, and the first mounting member and the second mounting member are integrally formed.

* * * * *